United States Patent [19]

Hanson

[11] Patent Number: 4,745,278

[45] Date of Patent: May 17, 1988

[54] CAPACITIVE BOLOMETER WITH IMPROVED RESPONSIVITY

[75] Inventor: Charles M. Hanson, Richardson, Tex.

[73] Assignee: Varo, Inc., Garland, Tex.

[21] Appl. No.: 922,311

[22] Filed: Oct. 23, 1986

[51] Int. Cl.⁴ .............................................. H01L 37/02
[52] U.S. Cl. ................ 250/338.2; 250/338.4
[58] Field of Search ............... 250/338 FE, 338 PY, 250/338 SE

[56] References Cited

U.S. PATENT DOCUMENTS

| | | | |
|---|---|---|---|
| 3,073,974 | 6/1959 | Hoh | 250/330 |
| 3,243,687 | 3/1966 | Hoh | 250/330 |
| 3,604,933 | 9/1971 | Cross et al. | 250/336.1 |
| 3,983,395 | 9/1976 | Kim | 250/338 SE |
| 4,080,532 | 3/1978 | Hopper | 250/338 FE |
| 4,162,402 | 7/1979 | Hopper | 250/332 |
| 4,250,384 | 2/1981 | Pulvari | 250/330 |

Primary Examiner—Carolyn E. Fields
Assistant Examiner—John A. Miller
Attorney, Agent, or Firm—Jerry W. Mills; Jefferson Perkins

[57] ABSTRACT

The capacitive bolometer comprises a detection capacitor having a first-order phase transition ferroelectric material between two electrodes. The detection capacitor operates during a detection step and a subsequent readout step. During the detection step, a preselected electric field is applied to the detection capacitor to maximize its sensitivity to temperature. A second electric field is applied to the capacitor during the readout step in order to increase responsivity of the detection cell. The detection cells according to the invention can be assembled into disclosed detection arrays.

29 Claims, 4 Drawing Sheets

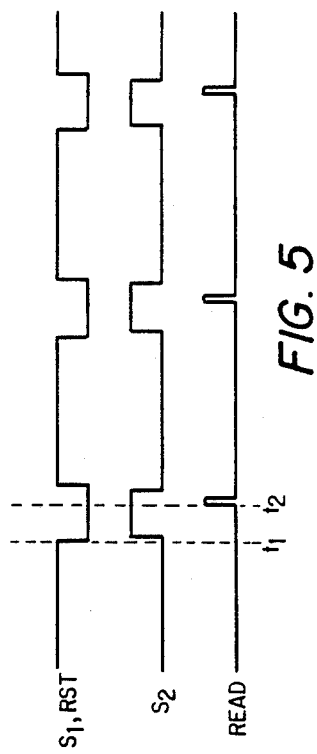
FIG. 4
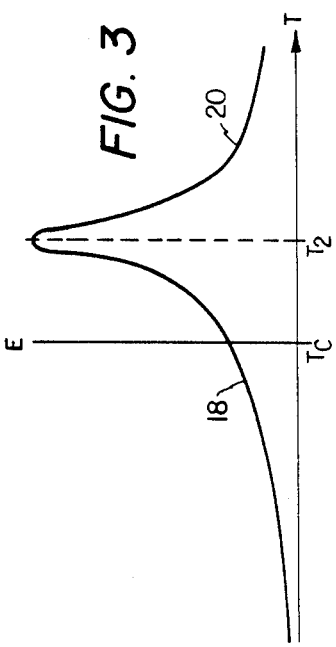
FIG. 5
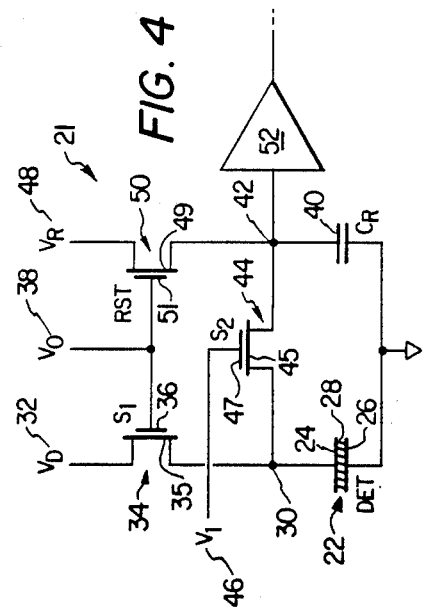
FIG. 1
FIG. 2
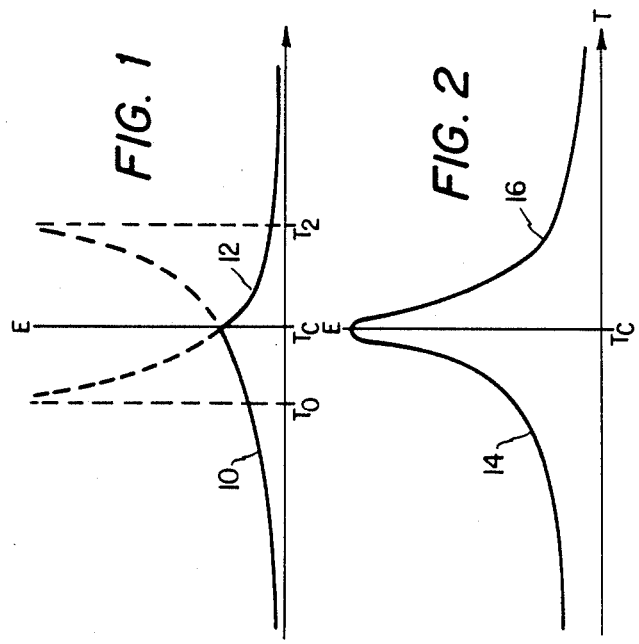
FIG. 3

CAPACITIVE BOLOMETER WITH IMPROVED RESPONSIVITY

TECHNICAL FIELD

This invention relates generally to infrared detection, and more particularly to infrared capacitive bolometers.

BACKGROUND OF THE INVENTION

Capacitive infrared detectors are known in the art that use a ferroelectric capacitor element. The dielectric constant of the material between the plates of a conventional ferroelectric capacitor varies with temperature. U.S. Pat. No. 3,073,974, issued to S. Hoh, is an early example of the application of ferroelectric physics to the problem of energy conversion. Conventional infrared capacitive detectors using the ferroelectric principle are illustrated in U.S. Pat. No. 4,080,532, issued to G. Hopper, and U.S. Pat. No. 4,250,384, issued to C. Pulvari.

These conventional or "voltage mode" infrared detectors suffer from two disadvantages. In general, responsivity of these detectors to temperature change is low, causing sensitivity to be limited by readout preamplifier noise. Also, a chopper has conventionally been required. The chopper presents a scene of uniform temperature to the ferroelectric sensing elements, such that they can be "zeroed" for the next scene using the temperature of the chopper. The requirement of a chopper results in increased mechanical complexity and a 50% loss of signal, as the chopper must be interposed between the field and the sensing elements each time a new image is to be recorded.

In view of the above, a need exists to provide a capacitive infrared bolometer that does not require a chopper, thus reducing mechanical complexity. Further, a need exists to provide a capacitive infrared bolometer that has increased responsivity to changes in scene temperature.

SUMMARY OF THE INVENTION

The present invention obviates the need for a chopper and increases responsivity due to the use of the following property of certain ferroelectric materials. These ferroelectric materials, called first-order phase transition ferroelectrics, exhibit a nonlinear change in their dielectric constant that is a function of both temperature and the applied electric field. A first preselected value of electric field is applied to the ferroelectric material such that the capacitance and its sensitivity to temperature change, or incident infrared radiation, is maximized. A second value of an electric field is applied to the ferroelectric material such that the capacitance and its sensitivity to temperature change is much smaller than at its first value.

According to the invention, this property of first-order transition phase ferroelectrics is used in the following manner. A ferroelectric material, such as one comprising Barium Titanate ($BaTiO_3$), is disposed between two capacitor electrodes or plates to form a detection capacitor. The detection capacitor is operated in two steps, a temperature detection step and a readout step. In the temperature detection step, an electric field, preselected to maximize the sensitivity of the capacitor to change in temperature, is applied across the ferroelectric material and the capacitor exposed to the infrared scene. Thereafter, a second preselected field is applied to the detection capacitor such that the dielectric constant of the ferroelectric material decreases, thereby decreasing the capacitance. The change in capacitance of the detection capacitor produces an excess charge that had occupied the detection capacitor electrodes. At the same time that the second electric field is applied, the excess charge is transferred to a reference capacitor. The voltage appearing at the detection capacitor and the reference capacitor is then read out by circuitry such as a high impedance amplifier.

The transfer of charge to a reference capacitor in the invention lends the name "charge mode" to the detection cell of the invention, as opposed to conventional "voltage mode" detection cells in which a variance in voltage at the cell is measured to obtain a direct analog reading of incident temperature.

In another embodiment of the invention, the detection capacitor comprises a layer of ferroelectric material and an adjacent semiconductor layer, both disposed between two electrodes. In the detection phase of operation, a reference voltage is applied to the detection capacitor, inducing an inversion layer in the semiconductor layer and establishing a relatively large capacitance value. In the readout phase, an injection pulse is applied to the detection capacitor, temporarily creating a depletion in the semiconductor layer and greatly lowering the capacitance of the detection capacitor. The voltage on the detection capacitor is read out shortly after the injection pulse is applied, to ensure that the semiconductor layer will still be in a depletion condition.

Novel ferroelectric detection capacitor arrays are described that employ the above detection cells.

BRIEF DESCRIPTION OF THE DRAWINGS

A more complete understanding of the invention may be had by reference to the following Detailed Description as taken in conjunction with the accompanying Drawings wherein:

FIG. 1 is a graph of the relative dielectric constant $\epsilon$ of a first-order phase transition ferroelectric material with respect to temperature, under a zero electric displacement;

FIG. 2 is a graph of dielectric constant versus temperature for a second-order phase transition ferroelectric material under a zero electric displacement;

FIG. 3 is a graph of the dielectric constant versus temperature for a first order phase transition ferroelectric material at a non-zero preselected electric displacement;

FIG. 4 is an electrical schematic diagram of a preferred ferroelectric detection cell and associated control circuitry;

FIG. 5 is a voltage timing diagram for the circuit shown in FIG. 4;

DETAILED DESCRIPTION

Ferroelectric Physics

Figure 6:
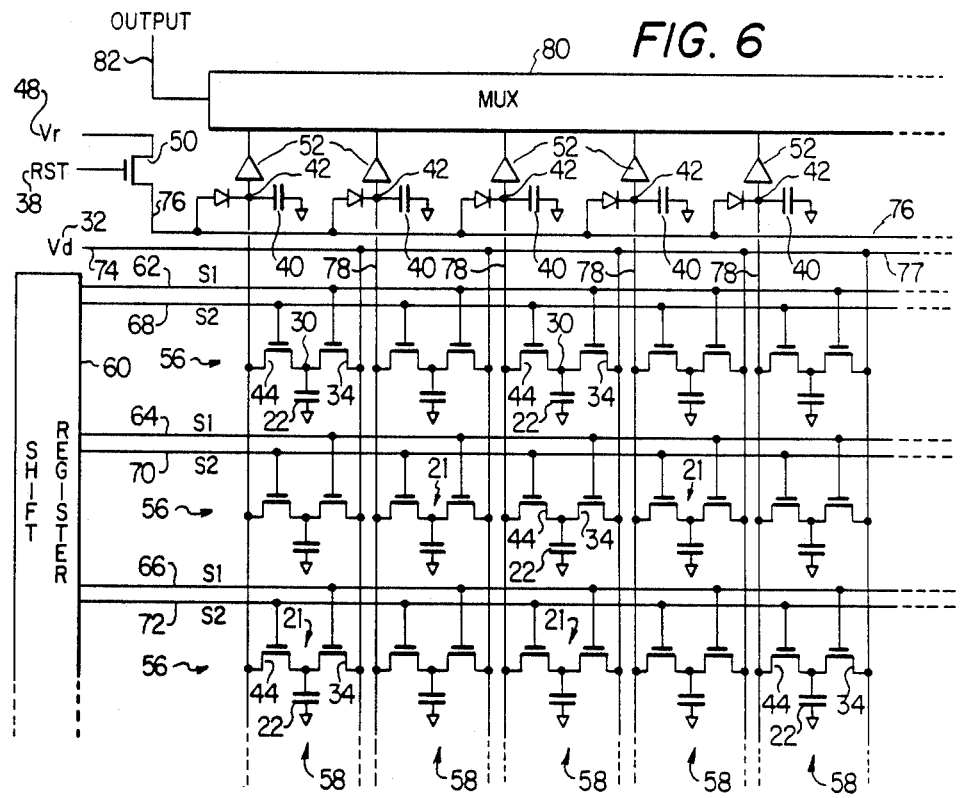
FIG. 6 is a schematic electrical diagram of an array of ferroelectric cells using the basic cell component shown in FIG. 4.

The free energy in a ferroelectric is given by the following equation:

$$G = \tfrac{1}{2}\beta(T-T_0)D^2 + \tfrac{1}{4}\gamma D^4 + 1/6\delta D^6 \quad (1)$$

where T is the temperature of the ferroelectric material, $T_0$ is the Curie-Weiss temperature or the lowest temperature at which a transition in the material can occur between ferroelectric and paraelectric phases in °K., D is the electric displacement or surface charge density in coulombs per meter$^2$, and $\beta$, $\gamma$ and $\delta$ are constants. Differentiating, the electric field in a ferroelectric device is given by $$E = \frac{\partial G}{\partial D} = \beta(T - T_0)D + \gamma D^3 + \delta D^5 \quad (2)$$

Differentiating once again the inverse dielectric constant $\epsilon^{-1}$ is given by $$\epsilon^{-1} = \frac{\partial E}{\partial D} = \beta(T - T_0) + 3\gamma D^2 + 5\delta D^4 \quad (3)$$

For first-order phase transition ferroelectric materials, that is, materials that demonstrate a first-order phase transition between ferroelectric and paraelectric phases, $\gamma$ is negative. For second-order phase transition ferroelectric materials, $\gamma$ is positive.

From Equation 3 it can be seen that the sensitivity of the ferroelectric material to temperature is at a maximum where the inverse dielectric constant approaches zero. Rearranging, the inverse dielectric constant vanishes whenever $$D^2 = \frac{-3\gamma}{10\delta}\left[1 \pm \sqrt{1 - \frac{20\delta\beta}{9\gamma^2}(T - T_0)}\right] \quad (4)$$

Equation 4 has no real solution whenever the ambient temperature T exceeds $T_2$, defined as $$T_2 = T_0 + \frac{9\gamma^2}{20\beta\delta} \quad (5)$$

However, if $D^2$ is set to $$D^2 = \frac{-3\gamma}{10\delta} \quad (6)$$

then $$\epsilon^{-1} = \beta(T - T_0) - \frac{9\gamma^2}{20\delta} = \beta(T - T_2) \quad (7)$$

It can be seen from the above mathematical argument that by the choice of an appropriate electric displacement and thus electric field, the change of the dielectric constant in a first-order ferroelectric material with respect to temperature can be maximized. As will be discussed below, this property can be used to provide a ferroelectric infrared detection cell having superior responsivity.

Turning now to the Drawings, FIG. 1 is a graph showing the relation of the relative dielectric constant $\epsilon$ to temperature in a first-order phase transition ferroelectric material under zero incident electric flux density. The curve shown in FIG. 1 has two segments. The first segment 10 is in the form of a hyperbolic curve having an asymptote at temperature $T_2$. Along this segment, the dielectric constant varies in proportion to $1/(T_2-T)$. Above $T_c$, the dielectric constant varies according to a decreasing hyperbolic function as shown in curve segment 12. The dielectric constant along curve segment 12 is proportional to $1/(T-T_0)$. The two curves intersect at the Curie temperature $T_c$ to define a maximum for the dielectric constant at that temperature. FIG. 1 is illustrative behavior of such materials as $BaTiO_3$.

Turning now to FIG. 2, a dielectric constant versus temperature curve is shown for a second-order phase transition ferroelectric material, such as tryglycine sulphate (TGS). The curve is for zero electric displacement on the measured material. In a second-order phase transition material, the Curie temperature $T_c$ serves as an asymptote for a ferroelectric curve segment 14 as well as a paraelectric segment 16. As the Curie temperature is approached from either the paraelectric or the ferroelectric side, there is a dramatic increase in the dielectric constant that theoretically approaches $T_c$ asymptotically. Within a few millidegrees of $T_c$ there is however some rounding. It can be seen that under zero electric displacement conditions, the sensitivity to a change of temperature around the Curie temperature of a second-order ferroelectric is much greater than that of a first-order ferroelectric. However, this greater sensitivity is not realized because the electric field that must be applied to measure it also degrades it. If a first-order ferroelectric were induced by application of an electric field to behave as a second-order ferroelectric, the sensitivity of the ferroelectric to temperature would be greatly improved.

FIG. 3 illustrates the dielectric constant vs. temperature curve for a first-order phase transition ferroelectric material under a preselected nonzero electric displacement. The case illustrated in particular is barium titanate. As the charge density or electric displacement is increased, the asymptote at $T_0$ shifts position until it is identical with the asymptote at $T_2$. When this happens, the point at which the dielectric constant increases to a theoretical maximum can be obtained as a real solution, rather than being cut off by the other hyperbolic segment as is the case under zero incident electric flux density conditions (see FIG. 1). Thus, under a particular incident electric displacement that can be preselected, a first-order phase transition ferroelectric material can be made to behave as a second-order material, with a consequent large increase in sensitivity of the material to temperature. For barium titanate, it has been found that $T_0 = 391.0°$ K.; $T_c = 403.0°$ K.; and $T_2 = 419.80°$ K. It has been found that an electric displacement of 0.1057 coulombs/m$^2$ will produce the condition shown in FIG. 3 for barium titanate.

FERROELECTRIC CELLS

FIG. 4 illustrates a preferred embodiment by which the above revealed property can be used to greatly increase the sensitivity, and therefore the responsivity, of a ferroelectric detection apparatus. A preferred ferroelectric detector cell is indicated generally at 21. Cell 21 is provided with a detection capacitor 22 having two electrodes 24 and 26. A first-order phase transition ferroelectric material 28, such as one comprised of BaTiO₃, is disposed between electrodes 24 and 26. Electrode 26 is connected to ground and electrode 24 is connected to a node 30.

The value of a detection voltage source 32 is preselected in order to maximize the sensitivity of the dielectric constant of ferroelectric material 28 with respect to temperature. Detection voltage source 32 is connected to node 30 via a switching transistor 34. A current path 35 of switching transistor 34 is controlled by a control electrode 36 onto which a switching voltage 38 may be selectively applied.

A reference capacitor 40 has one of its electrodes connected to a node 42, and another of its electrodes connected to ground. Reference capacitor 40 may be a discrete component, or it may merely represent a summation of small parasitic capacitances in the circuit that are electrically connected as shown. A switching transistor 44 has a current path 45 that is operable to selectively connect nodes 30 and 42. The current path is controlled by a switching voltage 46 which may be selectively impressed on the control electrode 47 of switching transistor 44. A reference voltage source 48 having a preselected value is selectively connected to node 42 via the current path 49 of a switching transistor 50. The control electrode 51 of switching transistor 50 is in turn energized by switching voltage 38. Readout circuitry, such as a high-impedance amplifier 52, is connected to node 42. The apparent capacitance of amplifier 52 may be included in the representational reference capacitor 40.

The operation of the detection circuit shown in FIG. 4 can be described with the assistance of the timing diagram shown in FIG. 5. In the beginning of the sequence of operation, switches S₁ and RST are closed, and switch S₂ is open. Detection voltage 32 is therefore impressed on detection capacitor 22, and reference voltage 48 is likewise impressed on reference capacitor 40. Voltages 32 and 48 are preferably of opposite polarity. Switches S₁ and RST are held closed until equilibrium on capacitors 22 and 40 is reached. In this condition, detection capacitor 22 will experience a preselected electric field such that its sensitivity to a change in temperature or in incident infrared radiation is nearly maximum.

Next, switches S₁ and RST are opened at time $t_1$. In this condition, the charge on detection capacitor 22 will be fixed according to the value of the dielectric constant, which depends upon the temperature of the detection capacitor 22 at time $t_1$. The charge on reference capacitor 40 will be fixed according to the values of $C_R$ and $V_R$.

Thereafter, switch S₂ is closed. This causes an equalization of the voltages on detection capacitor 22 and reference capacitor 40 and a redistribution of charge. After the circuit again reaches equilibrium, the voltage at node 42 is read during a read pulse beginning at $t_2$. Switch S₂ is thereafter opened and switches S₁ and RST are closed in order to reset the circuit for the next read cycle.

The responsivity R of the circuit shown in FIG. 4 is given by the following equation:

$$R = \frac{\eta}{G} \frac{dV}{dT} = \frac{\beta \eta d}{G} \left( \frac{CD' - CD}{C_R + C'} \right) \quad (8)$$

where $\eta$ is the absorption coefficient of detection capacitor 22, G is its thermal conductance in Watts/°K., V is the voltage across the detection capacitor and the reference capacitor after the charge has been redistributed, $\beta$ is a temperature coefficient as expressed in equations 1-3, d is the distance between the detection capacitor electrodes 24 and 26 in meters, C is the capacitance of the detection capacitor before charge is redistributed, C' is the capacitance of detection capacitor 22 after the charge has been redistributed, $C_R$ is the reference capacitance, D is the electric surface charge density on the detection capacitor before charge is redistributed (Coul/m²), and D' is the surface charge density on the detection capacitor after charge has been redistributed.

The expression for the responsivity of a detection circuit of the invention differs principally from that of a conventional detector in that the term CD is present in the numerator. Since D can be chosen to be negative, the responsivity can be at least doubled over conventional infrared capacitive bolometers. Furthermore, the presence of the CD term permits the numerator and denominator to be independently optimized, as has been described herein, by making C large and C' small. For first-order ferroelectric materials, R can be maximized by choosing D as $$D = -\sqrt{-\frac{\gamma}{10\delta}\left(1 + \sqrt{1 + \frac{20\delta}{3\gamma^2}\beta(T-T_0)}\right)} \quad (9)$$

A value for D' is determined experimentally. For barium titanate, it has been found that the best point of operation is D'≃0. For BaTiO₃, Constant $\beta$ for BaTiO₃ equals $7.33 \times 10^5$ m/F—°K.; $\gamma = -1.26 \times 10^9$ V—m⁵/Coul³; and $\delta = 3.39 \times 10^{10}$ V—m⁹/Coul⁵. At these values, an optimum charge density D was found to be $-0.1057$ Coul/m² and a responsivity of $1.5 \times 10^7$ was obtained. Using similar materials with a ferroelectric capacitor of similar area and dimensions, one conventional voltage-mode detection circuit realizes a responsivity only of $4.46 \times 10^4$.

FIG. 6 shows how the ferroelectric detection cell of FIG. 4 can be incorporated into a detector array. Like components as shown in FIG. 4 are numbered the same in FIG. 6. For purposes of the description, only a small number of rows 56 and columns 58 of detection cells 21 of the array are shown, it being understood that the array can be extended horizontally and vertically. Starting from a shift register 60, a plurality of S₁ lines 62, 64 and 66 are connected to the electrodes of those switching transistors 34 that are in their respective rows. Likewise, a plurality of S₂ lines 68, 70, and 72 are connected to the gates of switching transistors 44 in their respective rows. Either all of the sources or all of the drains of switching transistors 34 are connected in common to a $V_D$ source 32 via a detection voltage line 74. The other of the sources and drains of switching transistors 34 are connected to nodes 30, and ferroelectric detection capacitors 22 are connected between respective nodes 30 and ground. Each node 30 is likewise connected to the source or drain of a respective switching transistor 44.

The opposite ends of the curren paths of transistors 44 are all connected in common, through circuit isolating diodes, to a reference line 76. Reference line 76 is connected through a RESET switching transistor 50 to a reference voltage 48. Switching transistor 50 is controlled by having a reset clock voltage 38 selectively applied to its control electrode.

Reference line 76 is also connected through respective circuit-isolating diodes 77 to a plurality of nodes 42, one for each column 58 of detection cells, by respective lines 78. Each node 42 is connected to a respective reference capacitor 40, which in turn is connected to ground. Each node 42 is also connected to reading circuitry such as a high impedance amplifier 52. Amplifiers 52 are in turn connected to a multiplexer 80. The multiplexed signal appears at output port 82.

Figure 7:
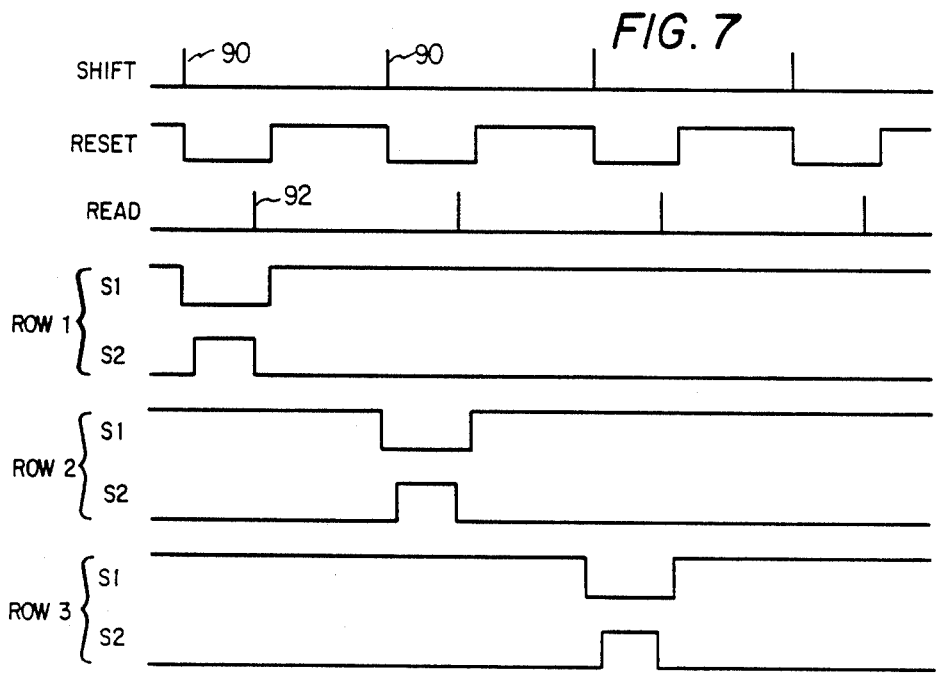
FIG. 7 is a voltage timing diagram for the detector array shown in FIG. 6.

The operation of the detection cell array shown in FIG. 6 may be best described in conjunction with its timing diagram depicted in FIG. 7. At the start of an operational cycle, RESET transistor switch 50 is closed, all switch lines $S_1$ (62, 64 and 66) are high, closing switching transistors 34. All switch lines $S_2$ (68, 70 and 72) are low, causing switching transistors 44 to be open. At the beginning of the cycle, the shift register 60 holds "0"s. When a given row sees a "0", $S_2$ will be low and $S_1$ will be high.

A "1" is then input at the top of the shift register 60 and rippled through. The "1" will descend one row each time a shift pulse 90 is sensed by the sense register.

Simultaneously with the sensing of a shift pulse 90, $S_1$ line 62 will go low. Reset transistor 50, which had been closed in order to impress $V_R$ on nodes 42 and thus charge capacitors 40, is brought low to isolate the $V_R$ source 48 from nodes 42. At the same time, switching transistors 34, which had been closed in order to impress the detection voltage 32 on detection capacitor 22, are opened. This isolates the subject row of cells from the voltage sources and allows them to float in response to incident infrared radiation.

A short time after the $S_1$ line 62 and reset transistor 38 go low, $S_2$ line 68 goes high, closing switching transistors 44 in the row. This allows the charge to redistribute itself between reference capacitor 40 and detection capacitor 22. The redistribution of charge causes a drop in surface charge density, and thus a drop in capacitance, in detection capacitor 22. As has been previously explained, this increases the responsivity of the circuit.

After capacitors 40 and 22 have reached equilibrium, a read pulse 92 causes amplifiers 52 to read the respective voltages at nodes 42. Simultaneously, $S_2$ goes low, isolating the reference capacitor from the detection capacitor. A short while after the voltages at nodes 42 have been read, $S_1$ goes high for that row. This completes the detection and read cycle for row 1. Upon the next shift pulse 90, the second row will be activated in a manner similar to the first row, and the cycle repeats for the remaining rows.

Figure 8:
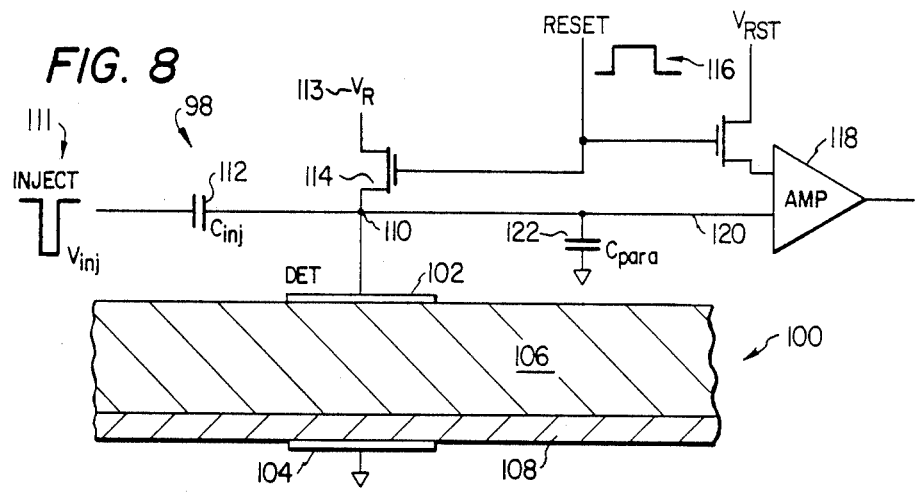
FIG. 8 is a part-schematic, part-sectional diagram of an alternate ferroelectric detection cell and related circuitry according to the invention.

Turning now to FIG. 8, an embodiment of the invention is shown which employs a charge-injection mode of operation. A detection cell indicated generally at 98 comprises a detection capacitor 100. Detection capacitor 100 has a first (voltage) electrode 102 and a second (ground) electrode 104. A first-order phase transition material such one comprising $BaTiO_3$ is disposed in a layer 106 adjacent the voltage electrode 102. A semiconductor layer 108 is disposed between ferroelectric layer 106 and ground electrode 104. Layer 108, which can be silicon, should be moderately doped to be a "leaky" semiconductor. Where a negative injection pulse is used (explained below), layer 108 should be doped P-type.

Voltage electrode 102 is connected to a node 110. Node 110 is electrically connected to a charge injection capacitor 112. Charge injection capacitor 112 is in turn connected to an injection pulse source 111. Node 110 is also connected to a reference voltage $V_R$ (113) through a reset transistor switch 114. A reset pulse source 116 can be selectively impressed upon the control electrode of a transistor 114 in order to open or close the current path between reference voltage 113 and node 110.

Node 110 is further connected to a high-impedance amplifier 118. A parasitic capacitance on line 120 is represented at 122, which also encompasses the capacitance of amplifier 118 as perceived by line 120.

Figure 9:
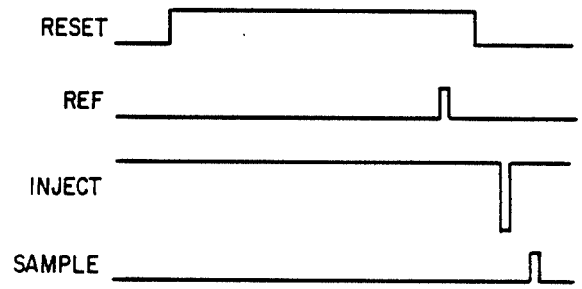
FIG. 9 is a voltage timing diagram for the embodiment shown in FIG. 8.

The operation of this embodiment of the invention may be explained with the assistance of the timing diagram shown in FIG. 9. First, reset switch 114 is closed, impressing $V_R$ on voltage plate 102, injection capacitor 112, and parasitic capacitance 122. Detection capacitor 100 will charge slowly compared to the other capacitors because of the time required for the formation of an inversion layer in the semiconductor layer 108. Therefore, semiconductor layer 108 must be of sufficiently low (e.g., highly doped) quality to permit capacitor 100 to be fully charge in the time allowed. Otherwise, the output signal will be a measure of charge generation in layer 108. Once the invention layer is formed, the detector capacitor will be equal to $C_f$, the capacitance of the ferroelectric layer 106.

Next, amplifier 118 is preset to the reset potential $V_{RST}$ 116 through a line 124. The output of amplifier 118 will then be proportional to $V - V_{RST}$, where V is the voltage read.

Next, a large, negative injection pulse is applied through injection capacitor 112. The potential of node 110 and voltage plate 102 becomes temporarily negative, and capacitors 112, 100 and 122 are temporarily discharged. In detection capacitor 100, the inversion charge existing on the surface between semiconductor layer 108 and ferroelectric material 106 is injected into the semiconductor bulk, where it combines with majority (P) carriers. When the circuit recovers from the injection pulse, the detection capacitor 100 does not immediately recharge because of the scarcity of minority carriers. At this point, the semiconductor surface with ferroelectric material 106 is in deep depletion, and its capacitance depends upon the depletion depth, or in the case of a sufficiently thin layer 108, the thickness of layer 108.

At this point, the detection capacitor capacitance may be written as follows:

$$C = \frac{C_d C_f}{C_d + C_f} \quad (10)$$

where C is the total detection capacitance, $C_f$ is the capacitance of the ferroelectric layer, and $C_d$ is the depletion capacitance of the semiconductor layer. Since $C_d$ is chosen to be much smaller than $C_f$, the above expression simplifies to $C_d$. The much smaller capacitance $C_d$ obtaining for the detection capacitor 100 at this point will cause the charge to be redistributed among $C_{inj}$ 112, $C_{para}$ 122, and detection capacitor 100. The voltage at node 110 is then sampled by high-impedance amplifier 118 in order to obtain a readout of the signal.

The responsivity of the embodiment shown in FIG. 8 is $$R = \frac{-d z \eta D}{G} \left( \frac{C_f}{C_{inj} + C_{para} + C_d} \right) \quad (11)$$

This represents an improvement with respect to voltage-mode detectors of a factor of $(C_{inj}+C_{para}+C_f)/(C_{inj}+C_{para}+C_d)$. In this embodiment, capacitor 100 behaves essentially as both a detection capacitor with a value of $C_f$ and a much smaller reference capacitor with a value of $C_d$.

Figure 10:
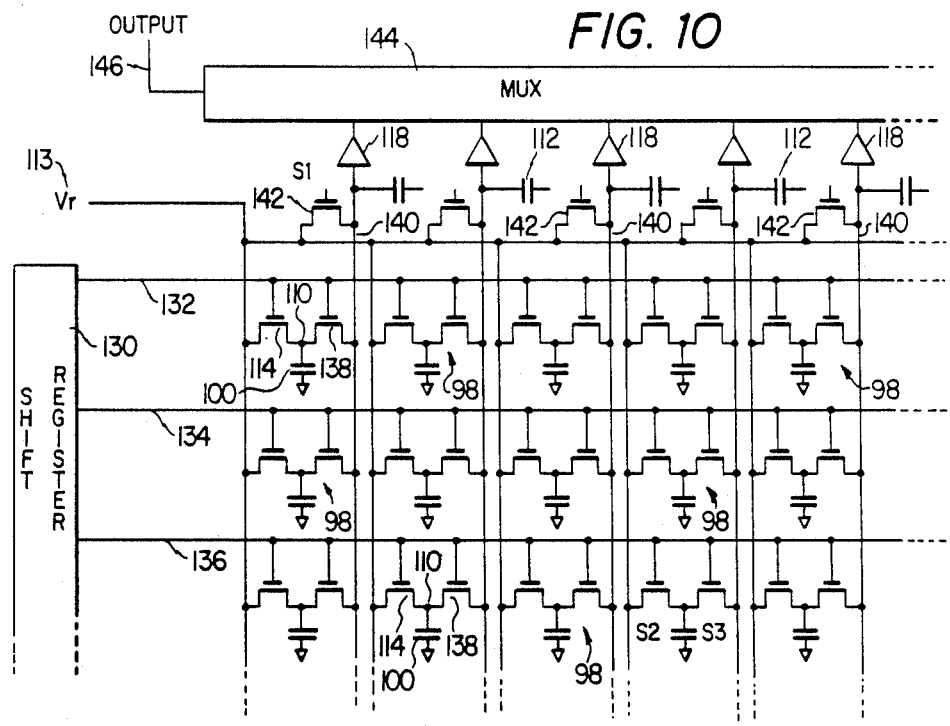
FIG. 10 is a schematic electric diagram of an array of ferroelectric detection cells using the basic cell component shown in FIG. 8.

Turning now to FIG. 10, an array of charge injection detection cells 98 is illustrated. In FIGS. 8 and 10, like components are numbered the same. A shift register 130 has as its outputs a series of row lines, only the first three of which (132, 134, and 136) are shown. Each row line 132, 134, and 136 connects with a corresponding row of cells in the following manner. For each cell 98, connections are made to a control electrode of a switching transistor $S_2$ (114), and the control electrode a switching transistor $S_3$ (138). Switching transistors 114 and 138 are selected so that when switching transistor 114 is on, switching transistor 138 is off, and vice versa. This may be accomplished by specifying the current paths of transistors 114 and 138 to be of opposite conductivity types. A reference voltage source 113 is selectively coupled through switching transistor 114 to a node 110, to which detection capacitor 100 is connected. Node 110 is further selectively coupled to a readout line 140 through a switching transistor 138. Readout line 140 is also selectively coupled to reference voltage 113 via a switching transistor $S_1$ (142). Readout line 140 further is connected to an injection capacitor 112, through which an injection pulse ($\Phi_{inj}$) is pulsed at preselected intervals. Each readout line 140 terminates in reading circuitry such as a high-impedance preamplifier 118, which in turn is connected to a multiplexer 144. The output from multiplexer 144 is made available at serial output port 146.

Figure 11:
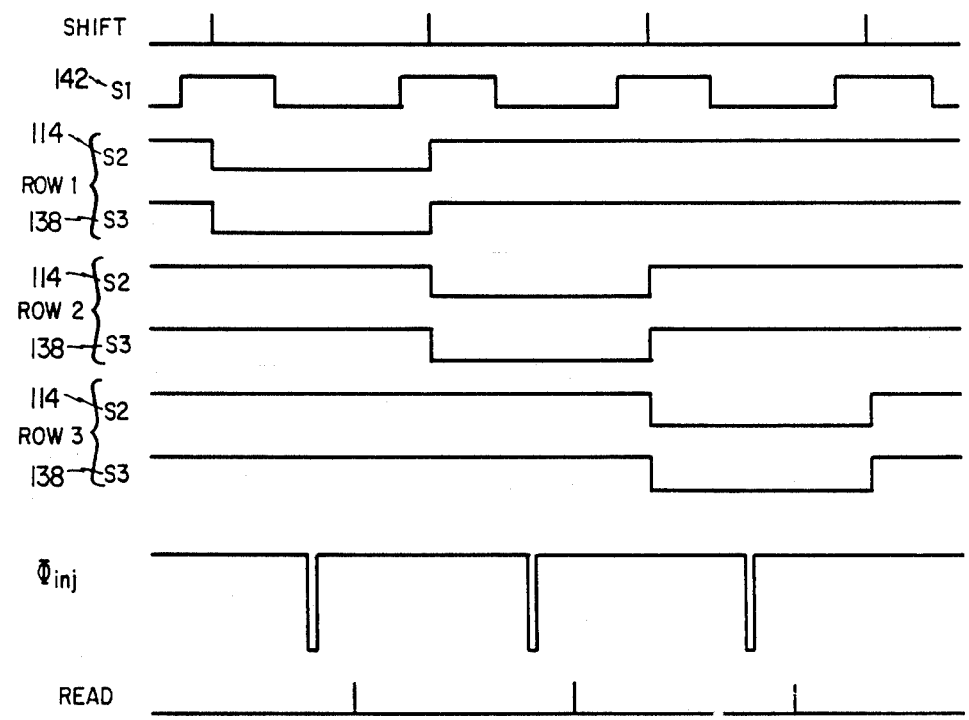
FIG. 11 is a voltage timing diagram for the array illustrated in FIG. 10.

The operation of the array illustrated in FIG. 10 may be described with the aid of the timing diagram shown in FIG. 11. At the beginning of each cycle, all switches $S_1$ 142 are open. When shift register 130 contains nothing but "0"s, lines 132, 134, 136 will be high, impressing a gate voltage on switching transistor pairs 114 and 138. In this condition, each switch $S_2$ 114 will be closed, and each switch $S_3$ 138 will be open. This causes $V_R$ to be applied to detection capacitors 100 while capacitors 100 are isolated from respective readout lines 140, injection capacitors 112 and preamplifiers 118.

Next, $S_1$ 142 is turned on, thereby presetting all of the readout lines 140 to $V_R$. This avoids partial injection of the detector charge when $S_3$ switches 138 for a particular row are closed.

When a "1" is input into the first position of shift register 130, line 132 is activated, opening all switches $S_2$ 114 and closing all switches $S_3$ 138 in the first row. All other rows remain unchanged. Switches $S_1$ 142 are then reopened. At this instant, all points in the circuit are at potential $V_R$. All detection capacitors 100 except those in the selected row are isolated from readout lines 140, but remain connected to reference $V_R$. The detectors in the selected row are connected to readout lines 140 and thence to preamplifiers 118 and are isolated from reference source 113. At this point, since $V_R$ is preselected to maximize the sensitivity of capacitors 100 to temperature, the voltage on capacitors 100 in the selected row will fluctuate significantly according to their temperatures.

Next, a large negative potential $\Phi_{inj}$ is applied through injection capacitors 112 and the detectors in the selected row behave as described in the single CID cell embodiment shown in FIG. 8. The reaction to the inject pulse $V_{inj}$ is allowed to stabilize, and then the signal is read by a read pulse communicated to preamplifiers 118. Multiplexer 144 collects the row of scene data thus read and transfers the data to serial output port 146. Switches S1 142 are then again closed, and the shift register 130 is stepped to address the next row. The cycle then repeats.

Figure 12:
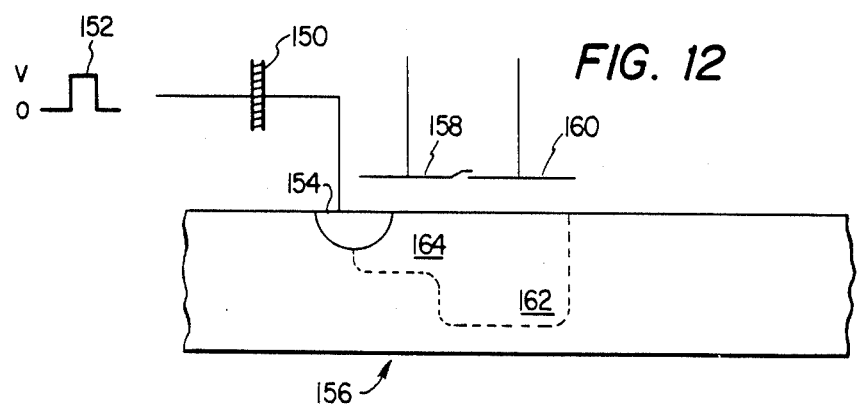
FIG. 12 is a charge-coupled device embodiment of the ferroelectric detection cell of the invention.

Turning now to FIG. 12, a part-schematic, part-sectional view of an embodiment of the invention employing a charge-coupled device (CCD) is shown. A ferroelectric detector 150 is connected between a voltage source 152 and an implanted diode region 154 in a semiconductor substrate 156. A transfer gate 158 and a storage gate 160 are separated from the semiconductor layer 156 by a suitable insulating layer (not shown).

The operation of this embodiment is as follows. As shown by dotted line 162, the storage gate is biased to deep depletion. Detection capacitor 150, diode 154 and a transfer region 164 provide a leakage path for accumulated charge. Therefore, storage gate 160 will contain beneath it an inversion layer of equal charge as the charge on the capacitor. After detection capacitor 150 is fully charged, the inversion charge in area 162 can be injected or transferred to a diode (not shown) for charge-to-voltage conversion at low capacitance. Various signal processing functions such as charge skimming and multiplexing (CCD or CID) can be readily accomplished once an inversion charge 162 is obtained.

In summary, a ferroelectric detector is disclosed having greatly increased responsivity over conventional devices. A first electric field is imposed on a ferroelectric capacitor, the first electric field being preselected to maximize the sensitivity of the ferroelectric capacitor to changes in temperature. Then, a second electric field is imposed on the capacitor in order to make the capacitance of the ferroelectric capacitor small. This lower charge density can be obtained by transferring a portion of the charge to a reference capacitor. The invention can take switched-capacitor, charge-injection or CCD embodiments, and these elements can be arranged in suitable detection arrays.

Although several embodiments of the invention have been illustrated in the accompanying drawings and described in the foregoing Detailed Description, it will be understood that the invention is not limited to the embodiments disclosed, but is capable of numerous rearrangements, modifications, substitutions of parts and elements without departing from the spirit of the invention as defined by the appended Claims.

What is claimed:
1. A capacitive bolometer comprising:
   a detection capacitor having two electrodes, a ferroelectric material between said electrodes exhibiting a first order phase transition between ferroelectric and paraelectric phases when the electric displacement between said electrodes is substantially zero, said capacitor responding during a detection step to a change in temperature; and,
   means for applying a preselected electric field between said electrodes during said detection step to maximize the sensitivity of said ferroelectric material to a change in temperature during said detection step, said preselected electric field being selected to cause said ferroelectric material to simulate a second order transition between ferroelectric and paraelectric phases.

2. The capacitive bolometer of claim 1, wherein said preselected electric field is selected such that the product of the electric displacement thereat and the dielectric constant of said ferroelectric material will be close to a maximum.

3. The capacitive bolometer of claim 1 wherein the operation of said bolometer includes a readout step following said detection step,
means for applying a second preselected electric field between said electrodes during said readout step, said second electric field selected to minimize the capacitance of said detection capacitor during said readout step.

4. A capactive bolometer, comprising;
a ferroelectric detection capacitor;
means for selectively impressing a detection voltage from a detection voltage source on said detection capacitor in order to maximize its capacitance;
a reference capacitor;
means for selectively coupling said reference capacitor with said detection capacitor;
means coupled to said reference capacitor for reading the voltage thereon;
means for selectively impressing a reference voltage from a reference voltage source on said reference capacitor;
said means for selectively impressing said detection and reference voltages being operable to decouple said capacitors from sources of said detection and reference voltage respectively, after said voltages have been impressed, said reference capacitor coupled with said detection capacitor after said capacitors have been respectively decoupled from said detection and reference voltage sources, and said means for reading a resultant voltage at said detection capacitor after said resultant voltage has reached equilibrium.

5. The capacitive bolometer of claim 4, wherein said reference voltage is selected to minimize the capacitance of said detection capacitor after said reference capacitor and said detection capacitor are coupled.

6. The capacitive bolometer of claim 4, wherein said reference capacitor has a capacitance much less than said detection capacitor.

7. The capacitive bolometer of claim 6, wherein said reference capacitor comprises stray capacitances in said bolometer.

8. The capacitive bolometer of claim 4, wherein said means for impressing said detection voltage and said reference voltage comprise first and second field effect transistors each having a control electrode and a current path, said control electrodes each connected to a signal source;
the current path of said first transistor connecting said detection voltage source with said detection capacitor, the current path of said second transistor connecting said reference voltage source with said reference capacitor.

9. The capacitive bolometer of claim 8, wherein said control electrodes are connected in common.

10. The capacitive bolometer of claim 4, wherein said means for selectively coupling said reference capacitor with said detection capacitor comprises a field effect transistor having a control electrode and a current path connecting said reference capacitor with said detection capacitor.

11. The capacitive bolometer of claim 4, wherein said means for reading comprises a high impedance amplifier.

12. A capacitive bolometer operating in detection and readout steps, comprising:
a ferroelectric detection capacitor, said capacitor having a first electrode, a ferroelectric layer having a surface opposed to said first electrode, a semiconductor layer adjacent said surface, said layers disposed between said first electrode and a second electrode;
means for causing said detection capacitor to exhibit a first capacitance, said means operable to impress a reference voltage on said first electrode so as to cause an inversion layer to form in said semiconductor and establishing said capacitance of said detection capacitor as approximately the capacitance of said ferroelectric layer during said detection step;
means for causing said detection capacitor to exhibit a second capacitance smaller than said first capacitance during said readout step, said means operable to impress an injection pulse on said first electrode after the establishment of said first capacitance so as to cause said semiconductor layer to go into depletion and establishing said second capacitance as approximately equal to the capacitance of said semiconductor depletion layer during said readout step.

13. The capacitive bolometer of claim 12, wherein said ferroelectric layer comprises barium titanate.

14. The capacitive bolometer of claim 12, wherein said ferroelectric layer comprises barium-strontium titanate.

15. The capacitive bolometer of claim 12, wherein said readout means comprises a high-impedance amplifier coupled to said detection capacitor for detecting a voltage at said first electrode during said readout step.

16. The capacitive bolometer of claim 12, further comprising a switching transistor means for selectively impressing said reference voltage on said first electrode, said switching transistor means having a current path and a control electrode, said current path of said transistor means connecting a reference voltage source with said first electrode, said control electrode of said transistor means activated by a reset signal.

17. The capacitive bolometer of claim 12, wherein said means for impressing said injection pulse comprises an injection capacitor coupled to said first electrode.

18. The capacitive bolometer of claim 12 and further including means for operating said bolometer in detection and readout steps in rapid succession at a predetermined sample rate, an RC time constant of said semiconductor layer being much less than said sample rate.

19. The capacitive bolometer of claim 12, wherein said semiconductor layer is of a conductivity type opposite to said charge injection pulse.

20. A capacitive bolometer operating in detection and readout steps, comprising:
means for causing said detection capacitor to exhibit a first capacitance during said detection step, said means operable to selectively impress a detection voltage on said detection capacitor;

means for causing said detection capacitor to exhibit a second capacitance during said readout step smaller than said first capacitance, the last said means comprising a reference capacitor and means for selectively impressing a reference voltage on said reference capacitor;

means for selectively coupling said detection capacitor with said reference capacitor after said detection voltage has been impressed on said detection capacitor and said reference voltage has been impressed on said reference capacitor;

readout means coupled to said detection capacitor, the voltage on said detection capacitor and said reference capacitor equalizing after said capacitors have been coupled, said readout means operable to sense the equalized voltage on said reference and said detection capacitors.

21. A capacitive bolometer operating in detection and readout steps, comprising:

a ferroelectric detection capacitor;

readout means coupled to said detection capacitor;

means for causing said detection capacitor to exhibit a first capacitance during said detection step;

means for causing said detection capacitor to exhibit second capacitance during said readout step, the last said means comprising a charge coupled device connected to said detection capacitor, voltage means causing a portion of charge incident on said detection capacitor to be transferred to said charge coupled device.

22. A method for detecting infrared radiation, comprising the steps of:

causing a first-order phase transition ferroelectric detection capacitor to exhibit a first capacitance that is near a maximum capacitance for the capacitor by impressing a first preselected detection voltage on the detection capacitor;

allowing the capacitance of the detection capacitor to vary in response to infrared radiation incident thereon;

causing said detection capacitor to exhibit a second capacitance substantially less than said first capitance by impressing a second preselected reference voltage on the detection capacitor;

removing charge from the detection capacitor as a result of said second capacitance; and reading a voltage present at an electrode of the detection capacitor while the detection capacitor exhibits the second capacitance.

23. The method of claim 22, wherein the step of removing charge from the detection capacitor comprises transferring charge to a reference capacitor.

24. The method of claim 23, further comprising the steps of:

connecting a detection voltage source with the detection capacitor at a first time;

connecting a reference voltage source with the reference capacitor at least as late as the first time;

allowing voltage equilibrium to be reached at the detection capacitor and the reference capacitor;

disconnecting the detection voltage source from the detection capacitor, and disconnecting the reference voltage source from the reference capacitor, after voltage equilibrium is reached;

connecting the detection capacitor and the reference capacitor in parallel at a second time subsequent to the attainment of voltage equilibrium in order to redistribute charge between the detection capacitor and the reference capacitor;

reading the voltage on the detection capacitor after charge has been redistributed;

disconnecting the detection capacitor from the reference capacitor after the step of reading.

25. A method for detecting infrared radiation, comprising the steps of:

impressing a reference voltage across a ferroelectric layer of a detection capacitor and a semiconductor layer of the detection capacitor adjacent the ferroelectric layer;

establishing an inversion region in the semiconductor layer in response to said reference voltage, such that a first capacitance of the detection capacitor equals the capacitance of the ferroelectric layer;

allowing the capacitance of the detection capacitor to vary responsive to infrared radiation incident thereon;

applying an injection pulse to an electrode of the detection capacitor opposite the semiconductor layer;

injecting a semiconductor inversion charge accumulated at the surface between the ferroelectric layer and the semiconductor layer into the bulk of the semiconductor;

recombining the inversion charge in the bulk of the semiconductor;

establishing a second capacitance as approximately equal to the depletion capacitance of the semiconductor layer and substantially less than the first capacitance;

removing charge from the detection capacitor as a result of the second capacitance; and reading a voltage present at an electrode of the detection capacitor while the detection capacitor exhibits the second capacitance.

26. The method of claim 25, further including the steps of:

connecting a reference voltage source with a readout means at a first time;

connecting said reference voltage source to said electrode at a second time subsequent to the first time;

allowing the detection capacitor to attain equilibrium with respect to the reference voltage;

applying the injection pulse through an injection capacitor connected to the electrode at a third time subsequent to the second time; and sampling the voltage on said electrode at a fourth time subsequent to the third time, said fourth time, selected such that the sampling occurs when the capacitance of the detection capacitor equals the second capacitance.

27. A method for detecting infrared radiation, comprising the steps of:

impressing a reference voltage on a ferroelectric detection capacitor to establish a capacitance of the capacitor at a value near a maximum capacitance thereof, said capacitance being dependent on the temperature of said capacitor;

transferring a portion of the charge incident on the detection capacitor to a storage capacitor; and using the amount of charge stored in the storage capacitor to determine a value for the sensed infrared radiation.

28. The method of claim 27, wherein the step of transferring the charge from the detection capacitor to the storage capacitor includes the steps of:

connecting the detection capacitor to a diode region formed in a semiconductor substrate;

energizing a transfer gate to create a transmission channel adjacent to the diode region in the semiconductor substrate; and transmitting a portion of the charge stored on the detection capacitor thrugh the diode region and the transmission channel to a storage region formed in the semiconductor substrate.

29. A method for detecting infrared radiation, comprising:

establishing an electric displacement across a first order phase transition ferroelectric capacitor selected to cause its dielectric constant to vary with a maximum sensitivity with respect to a change in incident infrared radiation;

exposing the capacitor to infrared radiation;

changing the electric displacement across said capacitor to decrease its dielectric constant; and reading the resultant voltage on said capacitor.

* * * * *